(12) United States Patent
Ogata (10) Patent No.: US 7,410,827 B2
(45) Date of Patent: Aug. 12, 2008

(54) SEMICONDUCTOR DEVICE AND METHOD OF FABRICATING THE SAME, CIRCUIT BOARD, AND ELECTRONIC INSTRUMENT

(75) Inventor: Yoshiharu Ogata, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 120 days.

(21) Appl. No.: 11/331,028

(22) Filed: Jan. 13, 2006

(65) Prior Publication Data
US 2006/0115930 A1    Jun. 1, 2006

Related U.S. Application Data

(62) Division of application No. 10/868,796, filed on Jun. 17, 2004, now abandoned.

(30) Foreign Application Priority Data

Jul. 4, 2003  (JP)  .............................. 2003-270972

(51) Int. Cl.
H01L 21/44 (2006.01)
H01L 21/48 (2006.01)
H01L 21/50 (2006.01)
(52) U.S. Cl. ..................... 438/106; 438/108; 438/109; 438/118
(58) Field of Classification Search .......... 438/107–112
See application file for complete search history.

(56) References Cited

U.S. PATENT DOCUMENTS 6,657,290 B2   12/2003   Fukui et al.
6,919,627 B2   7/2005    Liu et al.
2002/0096755 A1   7/2002   Fukui et al.

FOREIGN PATENT DOCUMENTS

| JP | A 8-88316 | 4/1996 |
|---|---|---|
| JP | A 2002-057272 | 2/2002 |
| JP | A 2002-076198 | 3/2002 |
| JP | A 2002-203939 | 7/2002 |
| JP | A 2002-222913 | 8/2002 |
| JP | A 2003-068971 | 3/2003 |
| JP | 2003179200 A * | 6/2003 |
| JP | A 2003-303937 | 10/2003 |
| JP | A 2004-253529 | 9/2004 |
| JP | A 2004-253693 | 9/2004 |

* cited by examiner

Primary Examiner—Cuong Q Nguyen
(74) Attorney, Agent, or Firm—Oliff & Berridge, PLC (57) ABSTRACT

A method of fabricating a semiconductor device, including: preparing a wiring board on which is mounted a first semiconductor chip having a plurality of first pads; electrically connecting each of the first pads to an interconnecting pattern of the first semiconductor chip by a wire; providing resin paste on the first semiconductor chip; mounting a second semiconductor chip having a plurality of second pads on the first semiconductor chip with the resin paste interposed therebetween; and forming a spacer by hardening the resin paste to fix the first and second semiconductor chips together, wherein the spacer is formed to extend under the second pads and further outward; and wherein the highest portion of the wire is disposed on the outer side of the first semiconductor chip.

13 Claims, 7 Drawing Sheets

SEMICONDUCTOR DEVICE AND METHOD OF FABRICATING THE SAME, CIRCUIT BOARD, AND ELECTRONIC INSTRUMENT

This is a Divisional of U.S. patent application Ser. No. 10/868,796 filed on Jun. 17, 2004 now abandoned, which is hereby incorporated by reference in its entirety. This application claims priority to Japanese Patent Application No. 2003-270972, filed on Jul. 4, 2003, which is hereby incorporated by reference in its entirety.

BACKGROUND OF THE INVENTION

The present invention relates to a semiconductor device and a method of fabrication thereof, a circuit board, together with an electronic instrument.

It is known to fabricate a single semiconductor device by stacking a plurality of semiconductor chips with spacers therebetween. In such a case, it is also known to use wires to connect the semiconductor chips electrically to an interconnecting pattern. In order to fabrication a thin semiconductor device with superlative mounting capabilities, it is preferable to reduce the thicknesses of the spacer and the semiconductor chips.

BRIEF SUMMARY OF THE INVENTION

According to a first aspect of the present invention, there is provided a method of fabricating a semiconductor device, comprising:

preparing a wiring board having an interconnecting pattern and on which is mounted a first semiconductor chip having a plurality of first pads;

electrically connecting each of the first pads to the interconnecting pattern by a wire;

providing resin paste on the first semiconductor chip;

mounting a second semiconductor chip having a plurality of second pads on the first semiconductor chip with the resin paste interposed between the first and second semiconductor chips such that at least part of the first pads is covered by the second semiconductor chip with a space between the first and second semiconductor chips; and forming a spacer by hardening the resin paste between the first and second semiconductor chips to fix the first and second semiconductor chips together, wherein the spacer is formed to extend under the second pads and further outward; and wherein the highest portion of the wire is disposed on the outer side of the first semiconductor chip.

According to a second aspect of the present invention, there is provided a method of fabricating a semiconductor device, comprising:

preparing a wiring board having an interconnecting pattern and on which is mounted a first semiconductor chip having a plurality of first pads;

electrically connecting each of the first pads to the interconnecting pattern by a wire;

providing resin paste on the first semiconductor chip;

mounting a second semiconductor chip having a plurality of second pads on the first semiconductor chip with the resin paste interposed between the first and second semiconductor chips such that at least part of the first pads is covered by the second semiconductor chip with a space between the first and second semiconductor chips; and forming a spacer by hardening the resin paste between the first and second semiconductor chips to fix the first and second semiconductor chips together, wherein the spacer is formed to extend under the second pads and further outward; and wherein the wire protrudes diagonally upward from a space above the first semiconductor chip.

According to a third aspect of the present invention, there is provided a semiconductor device comprising:

a wiring board having an interconnecting pattern;

a first semiconductor chip mounted on the wiring board and having a plurality of first pads;

a plurality of wires which electrically connect the interconnecting pattern and the first pads respectively;

a second semiconductor chip having a plurality of second pad and mounted on the first semiconductor chip such that at least part of the first pads is covered by the second semiconductor chip with a space between the first and second semiconductor chips; and a spacer which is formed between the first and second semiconductor chips and to fix the first and second semiconductor chips, wherein the spacer is formed to extend under the second pads and further outward; and wherein the highest portion of each of the wires is disposed on the outer side of the spacer.

According to a fourth aspect of the present invention, there is provided a semiconductor device comprising:

a wiring board having an interconnecting pattern;

a first semiconductor chip mounted on the wiring board and having a plurality of first pads;

a plurality of wires which electrically connect the interconnecting pattern and the first pads respectively;

a second semiconductor chip having a plurality of second pad and mounted on the first semiconductor chip such that at least part of the first pads is covered by the second semiconductor chip with a space between the first and second semiconductor chips; and a spacer which is formed between the first and second semiconductor chips and to fix the first and second semiconductor chips, wherein the spacer is formed to extend under the second pads and further outward; and wherein each of the wire protrudes diagonally upward from the spacer.

According to a fifth aspect of the present invention, there is provided a circuit board on which is mounted any one of the above semiconductor devices.

An electronic instrument according to a sixth aspect of the present invention comprises any one of the above semiconductor devices.

DETAILED DESCRIPTION OF THE EMBODIMENTS

The present invention may provide a semiconductor device having superlative mounting capabilities and reliability, a method of fabrication thereof, a circuit board, and an electronic instrument.

(1) According to one embodiment of the present invention, there is provided a method of fabricating a semiconductor device, comprising:

preparing a wiring board having an interconnecting pattern and on which is mounted a first semiconductor chip having a plurality of first pads;

electrically connecting each of the first pads to the interconnecting pattern by a wire;

providing resin paste on the first semiconductor chip;

mounting a second semiconductor chip having a plurality of second pads on the first semiconductor chip with the resin paste interposed between the first and second semiconductor chips such that at least part of the first pads is covered by the second semiconductor chip with a space between the first and second semiconductor chips; and forming a spacer by hardening the resin paste between the first and second semiconductor chips to fix the first and second semiconductor chips together, wherein the spacer is formed to extend under the second pads and further outward; and wherein the highest portion of the wire is disposed on the outer side of the first semiconductor chip.

In this method, the spacer is formed to extend under the second pads of the second semiconductor chip and further outward. This ensures that the second semiconductor chip is difficult to break, even if a load is applied to the second pads. In addition, the highest portion of each wire is disposed on the outer side of the first semiconductor chip. In other words, the height of the wires can be reduced above the first semiconductor chip. This makes it difficult for the wires to move, even when the resin paste flows, thus making it possible to prevent short-circuiting between neighboring wires. These features enable the fabrication of a highly reliable semiconductor device.

(2) According to one embodiment of the present invention, there is provided a method of fabricating a semiconductor device, the method comprising:

preparing a wiring board having an interconnecting pattern and on which is mounted a first semiconductor chip having a plurality of first pads;

electrically connecting each of the first pads to the interconnecting pattern by a wire;

providing resin paste on the first semiconductor chip;

mounting a second semiconductor chip having a plurality of second pads on the first semiconductor chip with the resin paste interposed between the first and second semiconductor chips such that at least part of the first pads is covered by the second semiconductor chip with a space between the first and second semiconductor chips; and forming a spacer by hardening the resin paste between the first and second semiconductor chips to fix the first and second semiconductor chips together, wherein the spacer is formed to extend under the second pads and further outward; and wherein the wire protrudes diagonally upward from a space above the first semiconductor chip.

In this method, the spacer is formed to extend under the second pads of the second semiconductor chip and further outward. This ensures that the second semiconductor chip is difficult to break, even if a load is applied to the second pads. Each wire is provided to protrude diagonally upward from the space above the semiconductor chip. In other words, it is possible to reduce the height of the wire in the space above the first semiconductor chip. This makes it difficult for the wires to move, even when the resin paste flows, thus making it possible to prevent short-circuiting between neighboring wires. These features enable the fabrication of a highly reliable semiconductor device.

(3) This method of fabricating a semiconductor device may further comprise making the resin paste flow out over the wiring board from the first semiconductor chip to form a fillet surrounding the first semiconductor chip. This forms the fillet around the first semiconductor chip on the wiring board. This means that the first semiconductor chip and the wiring board are protected by the fillet, enabling the fabrication of a highly reliable semiconductor device.

(4) In this method of fabricating a semiconductor device, the resin paste may be provided only over the first semiconductor chip; and the resin paste may flow out over the wiring board in the step of mounting the second semiconductor chip.

(5) In this method of fabricating a semiconductor device, the resin paste may include a plurality of insulating balls; and the insulating balls may be interposed between the first and second semiconductor chips.

(6) In this method of fabricating a semiconductor device, the step of electrically connecting the first pads to the interconnecting pattern may include connecting the wire electrically to the interconnecting pattern at first and then connecting the wire electrically to one of the first pads.

(7) In this method of fabricating a semiconductor device, the step of electrically connecting the first pads to the interconnecting pattern may include connecting the wire electrically to one of the first pads at first and then connecting the wire electrically to the interconnecting pattern.

(8) This method of fabricating a semiconductor device may further comprise electrically connecting each of the second pads to the interconnecting pattern by a wire, after the step of hardening the resin paste.

(9) According to one embodiment of the present invention, there is provided a semiconductor device comprising:

a wiring board having an interconnecting pattern;

a first semiconductor chip mounted on the wiring board and having a plurality of first pads;

a plurality of wires which electrically connect the interconnecting pattern and the first pads respectively;

a second semiconductor chip having a plurality of second pad and mounted on the first semiconductor chip such that at least part of the first pads is covered by the second semiconductor chip with a space between the first and second semiconductor chips; and a spacer which is formed between the first and second semiconductor chips and to fix the first and second semiconductor chips, wherein the spacer is formed to extend under the second pads and further outward; and wherein the highest portion of each of the wires is disposed on the outer side of the spacer.

In this semiconductor device, the spacer is formed in such a manner that it extends under the second pads of the second semiconductor chip and further outward. This ensures that the second semiconductor chip is difficult to break, even if a load is applied to the second pads. The wires are disposed in such a manner that the highest portions thereof are disposed on the outer side of the spacer. In other words, the height of the wires can be reduced above the first semiconductor chip. This makes it possible to reduce the thickness of the spacer. These features enable the provision of a semiconductor device which is highly reliable and which has superior mounting capabilities.

(10) According to one embodiment of the present invention, there is provided a semiconductor device comprising:

a wiring board having an interconnecting pattern;

a first semiconductor chip mounted on the wiring board and having a plurality of first pads;

a plurality of wires which electrically connect the interconnecting pattern and the first pads respectively;

a second semiconductor chip having a plurality of second pad and mounted on the first semiconductor chip such that at least part of the first pads is covered by the second semiconductor chip with a space between the first and second semiconductor chips; and a spacer which is formed between the first and second semiconductor chips and to fix the first and second semiconductor chips, wherein the spacer is formed to extend under the second pads and further outward; and wherein each of the wire protrudes diagonally upward from the spacer.

In this semiconductor device, the spacer is formed in such a manner that it extends under the second pads of the second semiconductor chip and further outward. This ensures that the second semiconductor chip is difficult to break, even if a load is applied to the second pads. The wires are provided in such a manner that they protrude diagonally upward from the spacer. In other words, it is possible to reduce the height of the wires above the first semiconductor chip. This makes it possible to reduce the thickness of the spacer. These features enable the provision of a semiconductor device which is highly reliable and which has superior mounting capabilities.

(11) This semiconductor device may further comprise a fillet disposed around the first semiconductor chip on the wiring board. This enables the fillet to reduce the effects of external forces on the first semiconductor chip and the wiring board. It is therefore possible to provide an even more reliable semiconductor device.

(12) In this semiconductor device, the spacer and the fillet may be of the same material.

(13) In this semiconductor device, the spacer may include a plurality of insulating balls.

(14) According to one embodiment of the present invention, there is provided a circuit board on which is mounted any of the above semiconductor devices.

(15) According to one embodiment of the present invention, there is provided an electronic instrument comprising any of the above semiconductor devices.

Embodiments of the present invention will be described below with reference to the accompanying figures. It should be noted, however, that the present invention is not limited to the embodiments below. A method of fabricating a semiconductor device in accordance with one embodiment of the present invention is illustrated in FIGS. 1 to 7.

Figure 1:
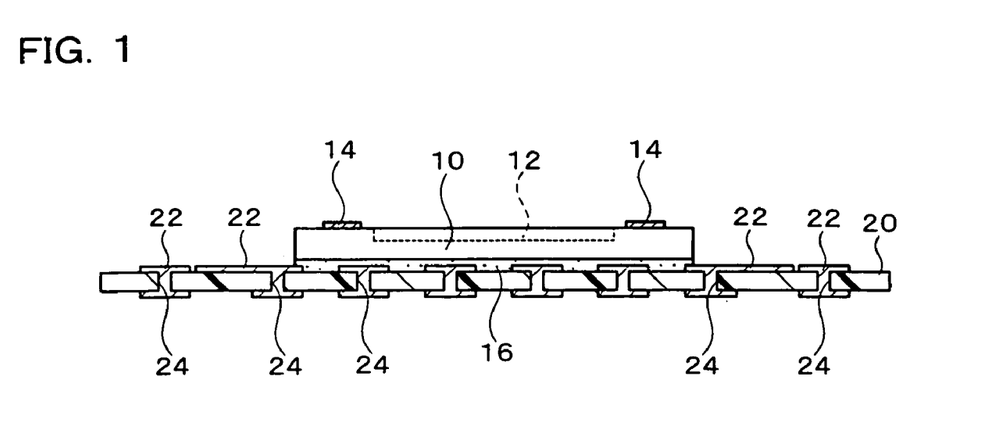
FIG. 1 is a diagram showing a method of fabricating a semiconductor device according to one embodiment of the present invention.

A method of fabricating a semiconductor device according to one embodiment of the present invention includes a step of preparing of a wiring board 20 on which is mounted a first semiconductor chip 10 and having an interconnecting pattern 22, as shown in FIG. 1.

An integrated circuit 12 formed of components such as transistors and memory elements could be formed on the first semiconductor chip 10. A plurality of first pads 14 is formed on the first semiconductor chip 10. The first pads 14 could be connected electrically to the interior of the first semiconductor chip 10. The first pads 14 could also be connected electrically to the integrated circuit 12. Alternatively, the configuration could include pads that are not connected electrically to the integrated circuit 12, which are called the first pads 14. The first pads 14 could be disposed at along two or four edges at end portions of one surface, or they could be disposed at a central portion. In addition, bumps (not shown in the figures) could be formed on the first pads 14. The first pads 14 could be formed of a metal such as an aluminum or copper type of metal. A passivation film (not shown in the figures) could also be formed over the first semiconductor chip 10, avoiding the central portion of each of the first pads 14. The passivation film could be formed of a material such as $SiO_2$, SiN, or a polyimide resin. Note that the shape in plan view of the first semiconductor chip 10 is not particularly limited, but it could be a rectangle (which includes a square), by way of example.

The wiring board 20 could be formed of any of a variety of organic materials (such as a polyimide substrate) or inorganic materials (such as a ceramic substrate or a glass substrate), or it could have a structure that is a composite of such materials (such as a glass-epoxy substrate). The shape in plan view of the wiring board 20 is not particularly limited, but it is most usually rectangular. The wiring board 20 could be a single-layer or a multi-layer substrate. The wiring board 20 could be a tape-shaped flexible substrate or a rigid substrate. The wiring board 20 could be termed an interposer. The wiring board 20 has the interconnecting pattern 22. The material of the interconnecting pattern 22 is not particularly limited, but it could have layers formed of Cu, by way of example. The interconnecting pattern 22 could be formed as either a single layer or as a plurality of layers. A plurality of through-holes 24 could be formed in the wiring board 20 to electrically connect one surface of the board to the other surface thereof. The through-holes 24 could be filled with conductive members (see FIG. 1), or they could be formed as through-holes with inner wall surfaces finished by plating. This enables electrical contact with both surfaces of the wiring board 20.

With this embodiment, the first semiconductor chip 10 is mounted on the wiring board 20. The first semiconductor chip 10 could be mounted on the wiring board 20 in such a manner that the surface thereof that is opposite to the surface on which the pads 14 are formed faces the wiring board 20, as shown in FIG. 1. The first semiconductor chip 10 could be fixed to the wiring board 20 by adhesive 16. In this case, an insulating adhesive could be used as the adhesive 16.

Note that this embodiment could configure a semiconductor device in which one wiring board 20 is mounted on one first semiconductor chip 10. However, it should be noted that it is also possible to mount a plurality of first semiconductor chips on one wiring board, to form a plurality of semiconductor devices in one batch.

Figure 2A:
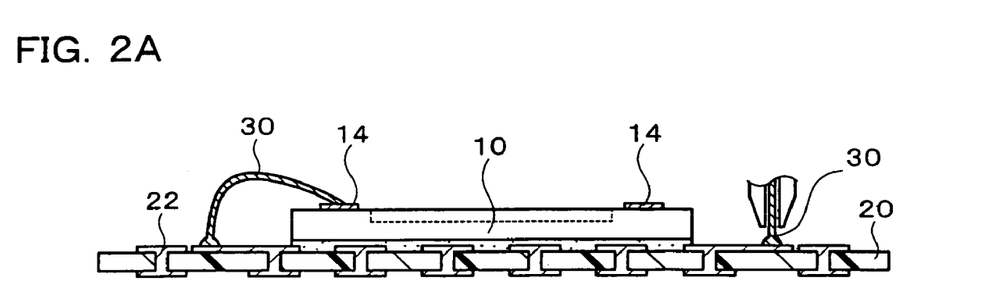
FIGS. 2A and 2B are diagrams showing a method of fabricating a semiconductor device according to one embodiment of the present invention.
Figure 2B:
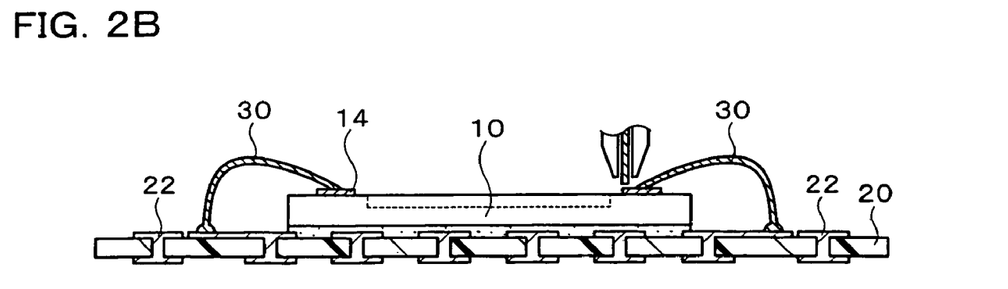

The method of fabricating a semiconductor device in accordance with this embodiment includes a step of electrically connecting each of the first pads 14 to the interconnecting pattern 22 by a wire 30 (see FIG. 2B). The material of the wire 30 is not particularly limited, but gold wire could be used therefor, by way of example. With this embodiment, the wire 30 is provided in such a manner that the highest portion thereof is disposed on the outer side of the first semiconductor chip 10, as shown in FIG. 2B. In other words, the wire 30 is provided to protrude diagonally upward from the space above the first semiconductor chip 10. This makes it possible to reduce the height of the wire within the space above the first semiconductor chip 10. Since this makes it possible to reduce the thickness of a spacer 60 (which will be described later), it enables the fabrication of a semiconductor device having superior mounting capabilities. Since the height of the wire 30 is reduced in the space above the first semiconductor chip 10, this makes it possible to prevent large movements of the wire 30 caused by the flowing of a resin paste 40, which will be described later. For that reason, it is possible to construct a highly reliable semiconductor device.

The wires 30 could be provided by any previously known method. For example, the wires 30 could be provided by first electrically connecting each wire 30 to the interconnecting pattern 22 (see FIG. 2A) then electrically connecting the wire 30 to the corresponding first pad 14 (see FIG. 2B). This makes it possible to reduce the angle subtended by the wire 30 and the first semiconductor chip 10. The height of the wire can be reduced thereby and it also makes it possible to fabricate a semiconductor device with superior mounting capabilities. Note that bumps could be formed on the first pads 14 in such a case (although this is not shown in the figures). In general, ultrasonic waves or heat are applied to the wires or electrodes when the wires are connected to the electrodes. The formation of a bump on each of the pads makes it possible to protect the first semiconductor chip 10 (particularly the integrated circuit 12) from such stresses, thus enabling the fabrication of an even more reliable semiconductor device.

Figure 3:
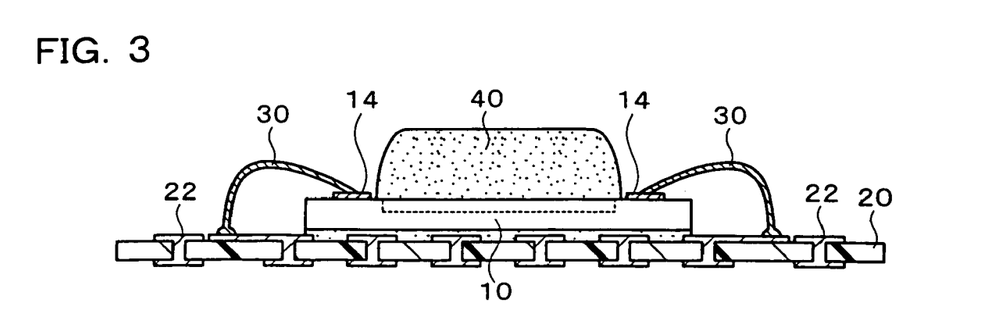
FIG. 3 is a diagram showing a method of fabricating a semiconductor device according to one embodiment of the present invention.

The method of fabricating a semiconductor device in accordance with this embodiment includes a step of providing the resin paste 40 over the first semiconductor chip 10, as shown in FIG. 3. The resin paste 40 could be of a hardening type. The hardening of the resin paste 40 forms the spacer 60. The material of the resin paste 40 is not particularly limited, but a resin that exhibits an adhesive force on hardening could be used therefor. The resin paste 40 could also have insulating properties. The resin paste 40 could be provided by using a dispenser to drop the resin paste 40 (potting). The resin paste 40 could be provided on the first semiconductor chip 10 alone, in which case it could be provided on a region within the first pads 14 (see FIG. 3). It should be noted, however, that the resin paste 40 could also be provided so as to extend over a region in which the first pads 14 have already been formed, although this is not shown in the figures).

Figure 4:
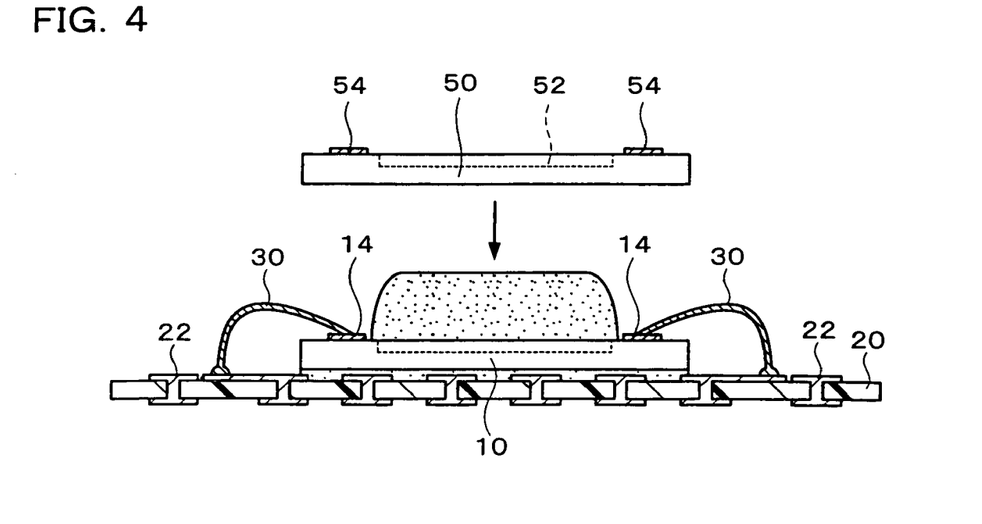
FIG. 4 is a diagram showing a method of fabricating a semiconductor device according to one embodiment of the present invention.

The method of fabricating a semiconductor device in accordance with this embodiment includes a step of mounting a second semiconductor chip 50 on the first semiconductor chip 10, as shown in FIG. 4. The details given in the description of the first semiconductor chip 10 can also apply to the second semiconductor chip 50. For example, the second semiconductor chip 50 could have an integrated circuit 52. A plurality of second pads 54 could be formed on the second semiconductor chip 50. Note that the outer dimensions are not limited in any way and they could be the same as those of the first semiconductor chip 10. In this embodiment, the second semiconductor chip 50 is mounted on the first semiconductor chip 10 with the resin paste 40 therebetween, in such a manner that at least part of the first pads 14 is covered by the second semiconductor chip 50 with a space between the first and second semiconductor chips (see FIG. 5). In such a case, the second semiconductor chip 50 could also be mounted in such a manner that a surface of the second semiconductor chip 50 opposite to the surface on which the second pads 54 are formed faces the first semiconductor chip 10 (or the resin paste 40), as shown in FIG. 4. The second semiconductor chip 50 could also be mounted so as not to touch the wires 30. This makes it possible to prevent short-circuiting between the wires 30 and the second semiconductor chip 50, enabling the fabrication of a highly reliable semiconductor device. Note that the surface of the second semiconductor chip 50 that faces the first semiconductor chip 10 could have an insulating layer formed thereon (although this is not shown in the figures). This also makes it possible to prevent short-circuiting between the wires 30 and the second semiconductor chip 50.

Figure 5:
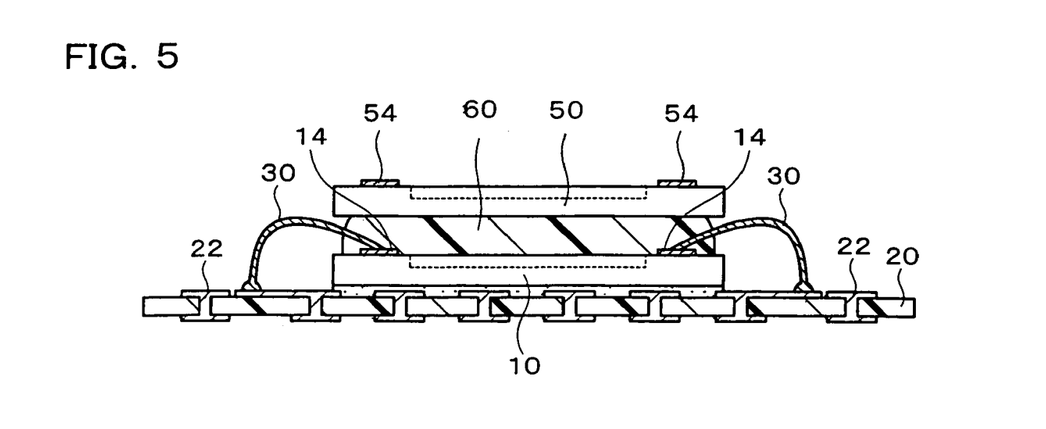
FIG. 5 is a diagram showing a method of fabricating a semiconductor device according to one embodiment of the present invention.

A method of fabricating a semiconductor device in accordance with this embodiment includes a step of causing the resin paste 40 to harden, to form the spacer 60 between the first semiconductor chip 10 and the second semiconductor chip 50 and fix the first and second semiconductor chips 10 and 50 together, as shown in FIG. 5. The processing for hardening the resin paste 40 differs with the type of resin paste 40, but a method such as thermal processing or irradiation with ultraviolet rays could be considered. The method of fabricating a semiconductor device in accordance with this embodiment ensures that the spacer 60 is formed and the first and second semiconductor chips 10 and 50 are fixed together by causing the resin paste 40 to harden. In other words, the step of forming the spacer 60 and the step of fixing together the first and second semiconductor chips 10 and 50 are done at the same time. This enables efficient fabrication of the semiconductor device.

In the method of fabricating a semiconductor device in accordance with this embodiment, the spacer 60 is formed so as to extend under the second pads 54 and further outward (see FIG. 5). In such a case, the surface of the spacer 60 in contact with the second semiconductor chip 50 could be formed to extend under the second pads 54 and further outward. This enables the spacer 60 to support the second semiconductor chip 50 over a wide area. This ensures that the second semiconductor chip 50 is not readily damaged, even if an external force is applied to the second semiconductor chip 50, enabling the fabrication of a highly reliable semiconductor device. In particular, this configuration makes it possible to prevent damage to the second semiconductor chip 50 due to forces applied in the vicinity of the second pads 54 during the bonding of the wires to the second pads 54 of the second semiconductor chip 50. The spacer 60 could be formed at any desired position and size, by adjusting the position and quantity of the resin paste 40 or by controlling the force pressing down on the second semiconductor chip 50, by way of example. Note that the spacer 60 could be formed within the region of the second semiconductor chip 50, as shown in FIG. 5. Alternatively, the spacer 60 could be formed to extend to the outside of the second semiconductor chip 50 (although this is not shown in the figures). This would enable similar effects.

Figure 6:
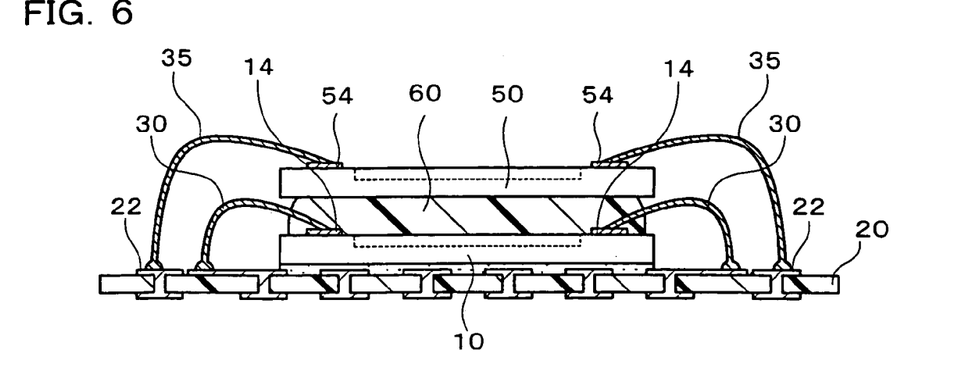
FIG. 6 is a diagram showing a method of fabricating a semiconductor device according to one embodiment of the present invention.
Figure 7:
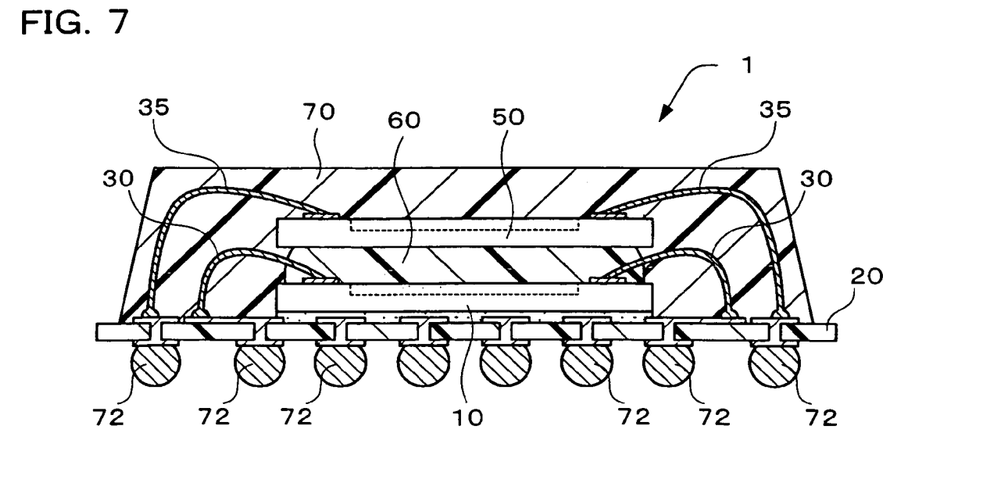
FIG. 7 is a diagram showing a method of fabricating a semiconductor device according to one embodiment of the present invention.

A method of fabricating a semiconductor device in this embodiment may include a step of electrically connecting the second pads 54 and the interconnecting pattern 22 by other wires 35, as shown in FIG. 6. This step is performed after the step of hardening the resin paste 40 to form the spacer 60. As described previously, the spacer 60 of this embodiment is formed to extend further outward than the undersides of the second pads 54. For that reason, the provision of the wires 35 after the formation of the spacer 60 makes it possible to prevent damage to the second semiconductor chip 50 in the step of providing the wires 35. Note that the wires 35 could be provided by any previously known method. In other words, the wires 35 could be provided by first electrically connecting each wire 35 to the interconnecting pattern 22 then electrically connecting the wire 35 to the corresponding second pad 54, in a similar step to that of providing the wire 30. This makes it possible to reduce the height of the wires 35, enabling the fabrication of a semiconductor device with superior mounting capabilities. It should be noted, however, that the wire 35 could be provided in such a manner that the wire 35 is first connected electrically to the corresponding second pad 54 and then the wire 35 is connected electrically to the interconnecting pattern 22.

Note that it is also possible to fabrication a semiconductor device having two or more semiconductor chips, by repeating the same steps. A semiconductor device 1 shown in FIG. 7 can be fabricating by a step of forming a sealing portion that seals in components such as the first and second semiconductor chips 10 and 50 and the wires 30 and 35 and a step of forming external terminals 72.

The semiconductor device in accordance with this embodiment of the present invention includes the wiring board 20 having the interconnecting pattern 22. The semiconductor device 1 includes the first semiconductor chip 10 mounted on the wiring board 20 and having the plurality of first pads 14 formed thereon. The semiconductor device 1 includes the wires 30 that electrically connect the interconnecting pattern 22 and each of the first pads 14. The semiconductor device 1 includes the second semiconductor chip 50 having a plurality of second pads 54 and mounted on the first semiconductor chip 10 in such a manner that at least part of the first pads 14 is covered by the second semiconductor chip 50 with a space between the first and second semiconductor chips. The semiconductor device 1 includes the spacer 60 which is formed between the first semiconductor chip 10 and the second semiconductor chip 50 and which fixes together the first and second semiconductor chips 10 and 50. The spacer 60 is formed so as to extend under the second pads 54 and further outward. Each wire 30 is provided in such a manner that the highest portion thereof is disposed on the outer side of the spacer 60. In other words, the wire 30 is provided in such a manner that it protrudes diagonally upward from the spacer 60. Note that the semiconductor device 1 could further include structural details that can be derived by those skilled in the art from the details described with reference to this method of fabricating a semiconductor device.

Figure 8:
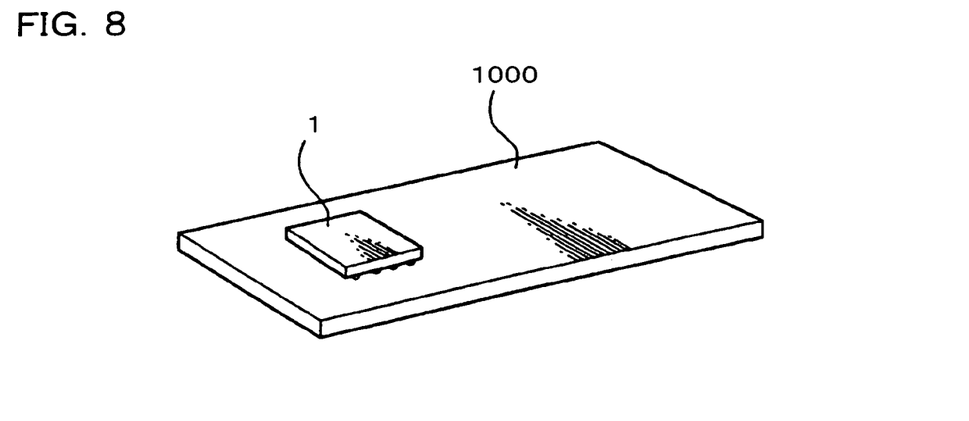
FIG. 8 is a diagram showing a circuit board on which is mounted a semiconductor device according to one embodiment of the present invention.
Figure 9:
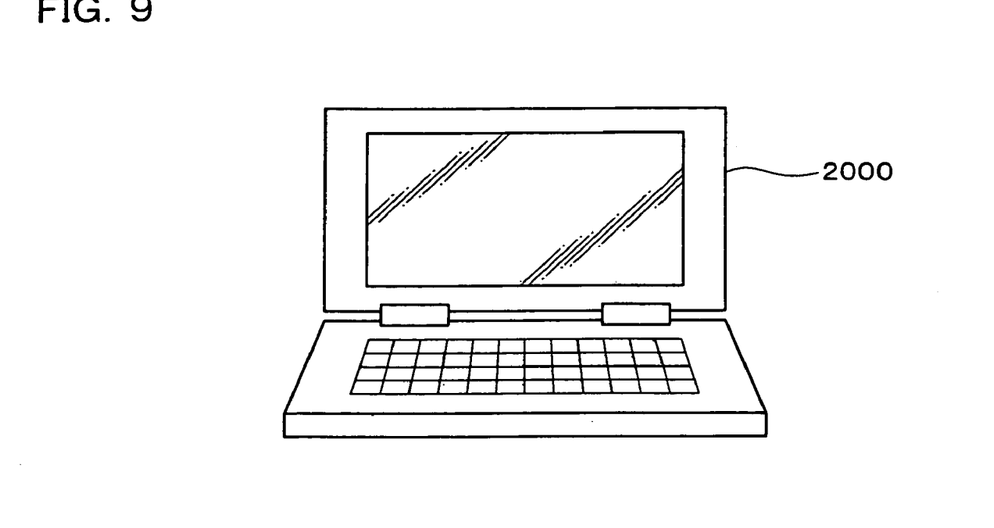
FIG. 9 is a diagram showing an electronic instrument having a semiconductor device according to one embodiment of the present invention.
Figure 10:
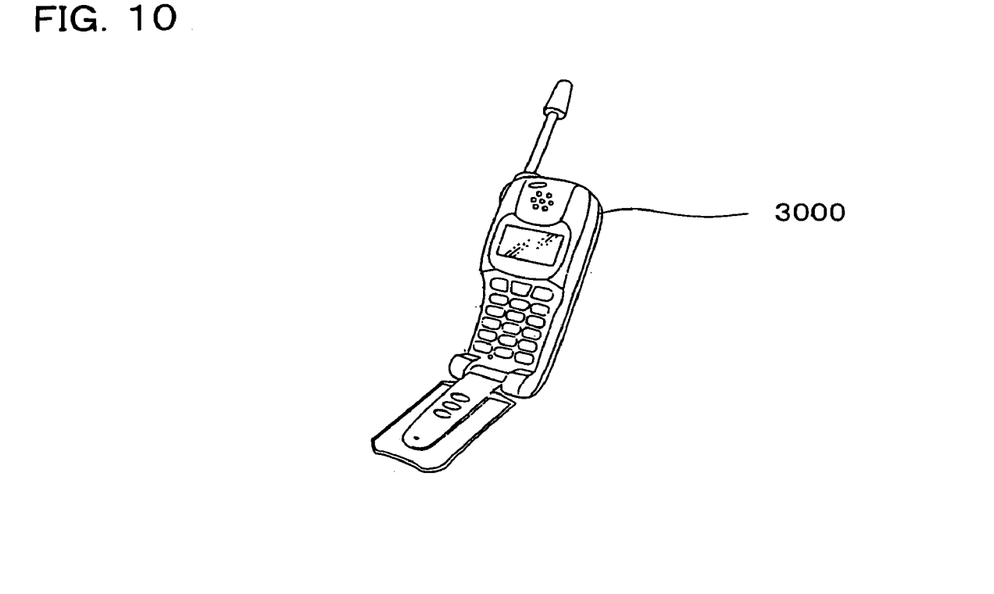
FIG. 10 is a diagram showing an electronic instrument having a semiconductor device according to one embodiment of the present invention.

As described above, the semiconductor device 1 in accordance with this embodiment of the present invention has the spacer 60 that is formed to extend under the second pads 54 and further outward. For that reason, a wide portion of the second semiconductor chip 50 is supported by the spacer 60. This ensures that the second semiconductor chip 50 is not readily damaged, even if an external force is applied to the second semiconductor chip 50, making it possible to provide a highly reliable semiconductor device. In addition, the wire 30 is disposed in such a manner that the highest portion thereof is disposed on the outer side of the spacer 60. In other words, the wire 30 protrudes diagonally upward from the spacer 60. This makes it possible to reduce the height of the wire 30 within the space above the first semiconductor chip 10. Since this ensures that the spacer 60 can be made thinner, it enables the fabrication of a semiconductor device with superior mounting capabilities. Note that in this case, the wire 30 could be disposed in such a manner that the highest portion thereof is on the outer side of the first semiconductor chip 10 too. In other words, the wire 30 could be provided in such a manner that it protrudes diagonally upward from the space above the first semiconductor chip 10. This makes it possible to obtain similar effects. A circuit board 1000 on which is mounted the semiconductor device 1 in accordance with this embodiment is shown in FIG. 8. A notebook personal computer 2000 shown in FIG. 9 and a portable phone 3000 shown in FIG. 10 are examples of electronic instruments having the semiconductor device 1.

Modifications

Figure 11A:
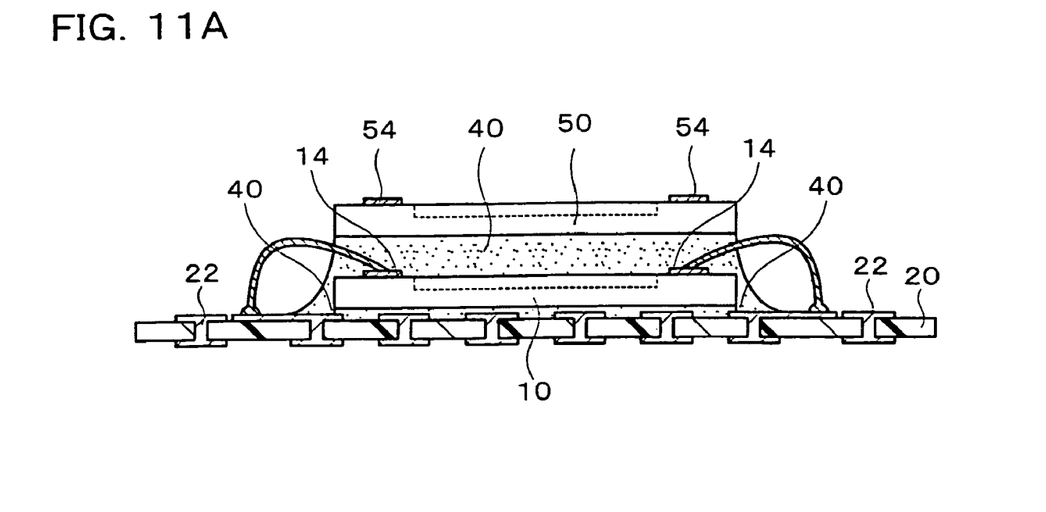
FIGS. 11A and 11B are diagrams showing a method of fabricating a semiconductor device according to a modification of one embodiment of the present invention.
Figure 11B:
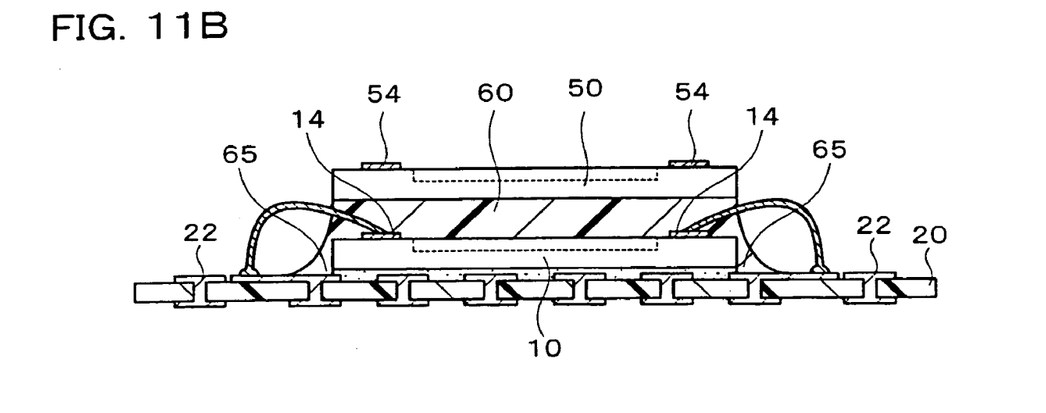

The present invention is not limited to the above-described embodiment and thus various modifications thereto are possible. For example, the method of fabricating a semiconductor device could further include a step of causing the resin paste 40 to flow out from the first semiconductor chip on to the wiring board 20 to form a fillet 65 surrounding the first semiconductor chip 10 (see FIG. 11B). In the step of providing the resin paste 40, the resin paste 40 could be provided only on the first semiconductor chip 10 (see FIG. 3), then in the step of mounting the second semiconductor chip 50, the second semiconductor chip 50 could be mounted in such a manner that the resin paste 40 flows out over the wiring board 20 (see FIG. 11A). It should be noted, however, that the resin paste 40 could be provided in such a manner that is flows out from the first semiconductor chip 10 during the step of providing the resin paste 40. The resin paste 40 could then be made to harden, to form the spacer 60 and the fillet 65 (see FIG. 11B). In this case, the fillet 65 is disposed around the first semiconductor chip 10 on the wiring board 20. The fillet 65 and the spacer 60 are formed of the same material. In this modification, the first semiconductor chip 10 is protected by the fillet 65, enabling the fabrication of an even more reliable semiconductor device. In particular, this enables the fabrication of a semiconductor device that is highly reliable with respect to external forces. In addition, the method described herein makes it unnecessary to provide an extra step of forming the fillet 65, enabling efficient fabrication of the semiconductor device.

Figure 12A:
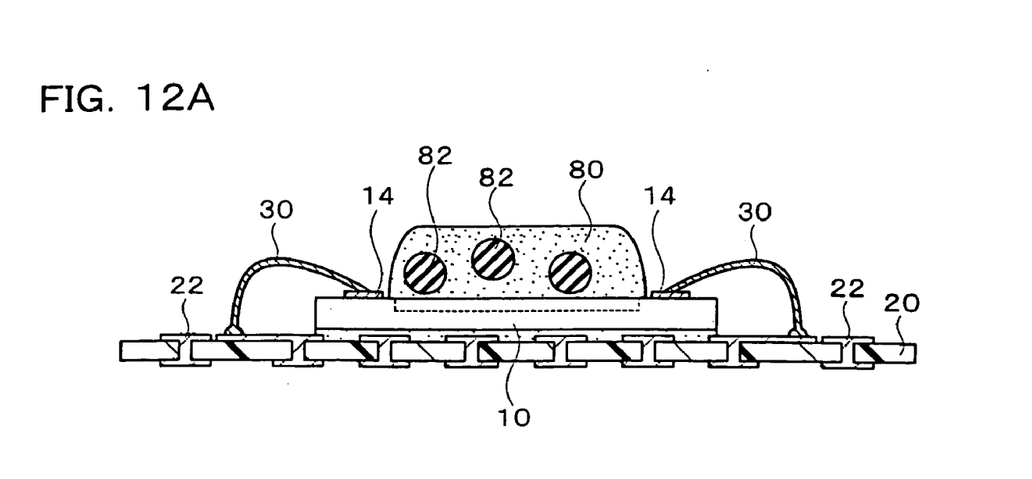
FIGS. 12A and 12B are diagrams showing a method of fabricating a semiconductor device according to a modification of one embodiment of the present invention.
Figure 12B:
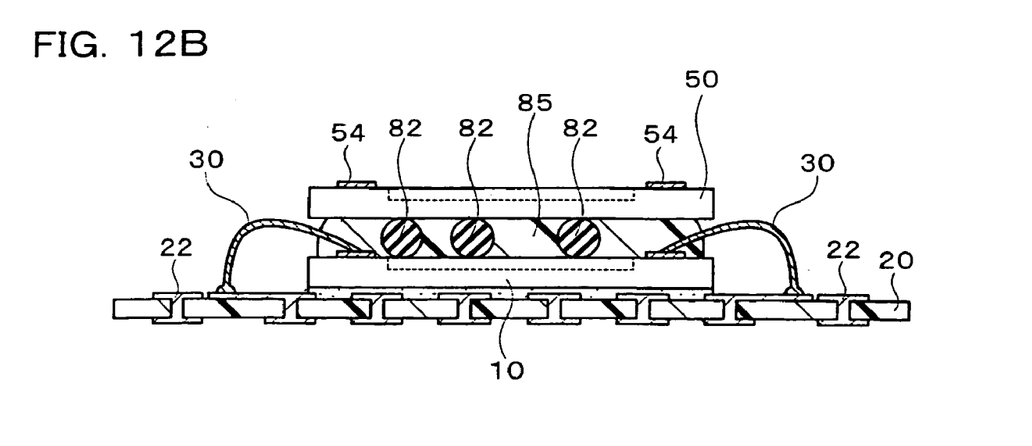

In a modification shown in FIGS. 12A and 12B, a resin paste 80 having insulating balls 82 included therein is used. In other words, the resin paste 80 that includes the insulating balls 82 is provided on the first semiconductor chip 10 (see FIG. 12A), and then the second semiconductor chip 50 is mounted on the first semiconductor chip 10 with the balls 82 interposed between the first and second semiconductor chips 10 and 50. A spacer 85 having a plurality of the balls therein could be formed by hardening this resin paste (see FIG. 12B). This makes it possible to limit the disposition of the second semiconductor chip 50 by the balls 82, enabling simple mounting of the second semiconductor chip 50.

Figure 13A:
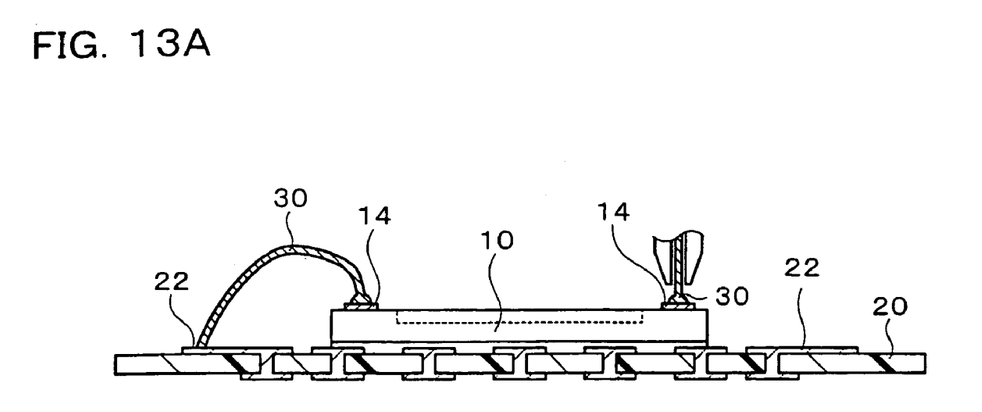
FIGS. 13A and 13B are diagrams showing a method of fabricating a semiconductor device according to a modification of one embodiment of the present invention.
Figure 13B:
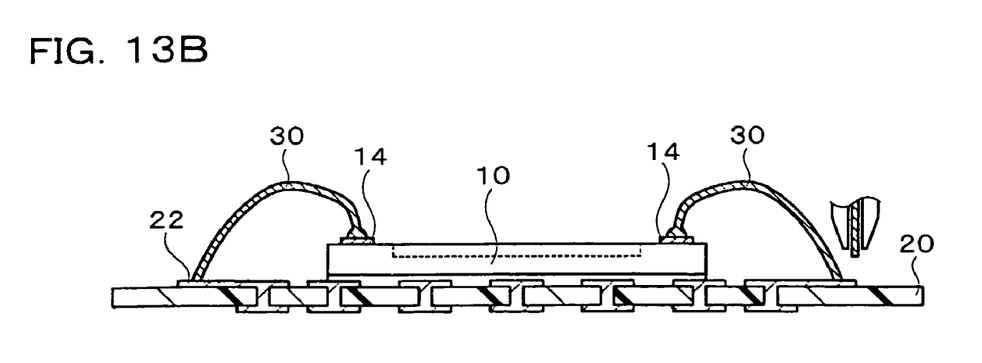

In another modification shown in FIGS. 13A and 13B, the wires 30 are provided by first electrically connecting each wire 30 to the corresponding first pad 14 (see FIG. 13A), then electrically connecting the wire 30 and the interconnecting pattern 22 (see FIG. 13B). In this case too, the wire 30 can be provided in such a manner that the highest portion of the wire 30 is disposed on the outer side of the first semiconductor chip 10, making it possible to reduce the height of the wire 30 above the first semiconductor chip 10. Since the wire 30 is extracted diagonally upward, it is possible to provide the wire with no abrupt bends. This makes it possible to reduce damage to the wires 30, enabling the fabrication of a highly reliable semiconductor device.

The description of the above embodiments can be applied to the configuration and fabrication method of these modifications other than those described above. In addition, the configuration of a semiconductor device according to one embodiment of the present invention could be formed of a combination of any components in the above description.

Note that the present invention is not limited to the above-described embodiments, and various modifications can be made. For example, the present invention includes various other configurations substantially the same as the configurations described in the embodiments (such as a configuration having the same function, method, and result or a configuration having the same objective and result). The present invention also includes a configuration in which an unsubstantial portion in the described embodiments is replaced. The present invention also includes a configuration having the same effects as the configurations described in the embodiments, or a configuration able to achieve the same objective. Further, the present invention includes a configuration in which a publicly known technique is added to the configurations in the embodiments.

What is claimed is:

1. A method of fabricating a semiconductor device, comprising:
    preparing a wiring board having an interconnecting pattern and mounting a first semiconductor chip on the wiring board, a surface of the first semiconductor chip having a first portion and a second portion and a first pad positioned on the first portion;
    electrically connecting the first pad to the interconnecting pattern by a wire;
    providing resin paste on the second portion of the surface of the first semiconductor chip so as not to deposit the resin paste on the first portion:
    mounting a second semiconductor chip having a second pad on the first semiconductor chip with the resin paste interposed between the first and the second semiconductor chips such that at least part of the first pad is covered by the second semiconductor chip with a space between the first and the second semiconductor chips; and
    forming a spacer by hardening the resin paste between the first and the second semiconductor chips to fix the first and the second semiconductor chips together,
    the spacer being formed to extend under the second pad and further outward, wherein a highest portion of the wire is disposed on an outer side of the first semiconductor chip.

2. The method of fabricating a semiconductor device as defined in claim 1, the electrically connecting the first pad to the interconnecting pattern including electrically connecting the wire to the interconnecting pattern first and then electrically connecting the wire to the first pad.

3. The method of fabricating a semiconductor device as defined in claim 1, further comprising:
    electrically connecting the second pad to the interconnecting pattern by another wire, after hardening the resin paste.

4. The method of fabricating a semiconductor device as defined in claim 1, the semiconductor chip including an integrated circuit which overlaps with the first portion and does not overlap with the first pad.

5. The method of fabricating a semiconductor device as defined in claim 1, further comprising:
    forming a sealing portion on the wiring board so as to seal the first and the second semiconductor chips, a space between the first and the second semiconductor chips being filled with at least a part of the sealing portion and the spacer.

6. The method of fabricating a semiconductor device as defined in claim 1, the entire spacer being positioned between the first and second semiconductor chips.

7. The method of fabricating a semiconductor device as defined in claim 1, the mounting the second semiconductor chip including controlling a pressure applied to the second semiconductor chip.

8. A method of fabricating a semiconductor device, the method comprising:
    preparing a wiring board having an interconnecting pattern and mounting a first semiconductor chip on the wiring board, a surface of the first semiconductor chip having a first portion and second portion, and a first pad positioned on the first portion;
    electrically connecting the first pad to the interconnecting pattern by a wire;
    providing resin paste on the second portion of the surface of the first semiconductor chip so as not to deposit the resin paste on the first portion;
    mounting a second semiconductor chip having a second pad on the first semiconductor chip with the resin paste interposed between the first and the second semiconductor chips such that at least part of the first pad is covered by the second semiconductor chip with a space between the first and the second semiconductor chips; and
    forming a spacer by hardening the resin paste between the first and the second semiconductor chips to fix the first and the second semiconductor chips together,
    the spacer being formed to extend under the second pad and further outward, wherein the wire protrudes diagonally upward from a space above the first semiconductor chip.

9. The method of fabricating a semiconductor device as defined in claim 8,
    the electrically connecting the first pad to the interconnecting pattern including electrically connecting the wire to the interconnecting pattern and then electrically connecting the wire to the first pad.

10. The method of fabricating a semiconductor device as defined in claim 8, further comprising:
    electrically connecting the second pad to the interconnecting pattern by another wire, after hardening the resin paste.

11. The method of fabricating a semiconductor device as defined in claim 8, the mounting the second semiconductor chip including controlling a pressure applied to the second semiconductor chip.

12. The method of fabricating a semiconductor device as defined in claim 1, wherein a height of the resin paste from the wiring board to a top surface of the resin paste is larger than a height of a highest portion of the wire from the wiring board before the step of mounting the second semiconductor chip.

13. The method of fabricating a semiconductor device as defined in claim 8, wherein a height of the resin paste from the wiring board to a top surface of the resin paste is larger than a height of a highest portion of the wire from the wiring board before the step of mounting the second semiconductor chip.

* * * * *